United States Patent [19]

Maruyama et al.

[11] Patent Number: 5,102,519
[45] Date of Patent: Apr. 7, 1992

[54] PROCESS FOR PREPARING A PRINTED-CIRCUIT BOARD

[75] Inventors: Tsutomu Maruyama; Kiyotake Fukawa; Yutaka Yoshikawa; Kiichi Mori; Atsushi Akiyama, all of Hiratsuka, Japan

[73] Assignee: Kansai Paint Co., Ltd., Amagasaki, Japan

[21] Appl. No.: 522,789

[22] Filed: May 14, 1990

[30] Foreign Application Priority Data

May 16, 1989 [JP] Japan ................ 1-122595

[51] Int. Cl.⁵ .................. H05K 3/06; C25D 13/12
[52] U.S. Cl. .................. 204/180.6; 156/659.1; 156/902; 204/180.2; 430/313; 430/318
[58] Field of Search .......... 204/180.2, 180.6; 430/313, 318, 323; 156/659.1, 901, 902

[56] References Cited

U.S. PATENT DOCUMENTS

| | | | |
|---|---|---|---|
| 3,492,213 | 1/1970 | Johnson | 204/181 |
| 3,497,356 | 2/1970 | Martinson | 96/86 |
| 3,554,886 | 1/1971 | Colomb, Jr. et al. | 204/159.2 |
| 3,558,741 | 1/1971 | Hotch et al. | 260/827 |
| 3,864,230 | 2/1975 | Springer et al. | 204/181 |
| 3,954,587 | 5/1976 | Kokawa | 204/181 |
| 4,024,039 | 5/1977 | Yoshida et al. | 204/181 |
| 4,040,925 | 8/1977 | McGinniss | 204/181 |
| 4,592,816 | 1/1986 | Emmons et al. | 204/180.6 |
| 4,632,900 | 12/1986 | Demmer et al. | 430/323 |
| 4,673,458 | 6/1987 | Ishikawa et al. | 156/659.1 |
| 4,845,012 | 7/1989 | Seko et al. | 430/287 |
| 4,985,344 | 1/1991 | Uchino et al. | 430/325 |

FOREIGN PATENT DOCUMENTS

| | | |
|---|---|---|
| 207139 | 10/1985 | Japan . |
| 206293 | 9/1986 | Japan . |
| 6070 | 1/1988 | Japan . |
| 60594 | 3/1988 | Japan . |
| 64-4671 | 1/1989 | Japan . |
| 64-4672 | 1/1989 | Japan . |
| 64-90270 | 4/1989 | Japan . |
| 1-121375 | 5/1989 | Japan . |
| 20873 | 1/1990 | Japan . |

Primary Examiner—John Niebling
Assistant Examiner—William T. Leader
Attorney, Agent, or Firm—Fisher, Christen & Sabol

[57] ABSTRACT

Disclosed is an improved process for preparing a printed-circuit board, which comprises successive steps of electrodeposition coating of a photosensitive resin on a printed-circuit base plate to form a photosensitive resist film, exposure to light through a pattern mask, development and etching, the improvement further comprising a step of dipping the photosensitive resist film formed by electrodeposition coating into an aqueous solution comprising water as a major component and applying a voltage to carry out electroendosmosis, whereby the tendency of the photosensitive resist film to stick to the pattern mask is reduced.

6 Claims, No Drawings

ID BOARD

BACKGROUND OF THE INVENTION (1) Field of the Invention

This invention relates to a process for preparing a printed-circuit board, and more particularly, to an improved process for preparing a printed-circuit board, in which water, solvent, neutralizing agent, etc. contained in a photosensitive resist film are reduced to improve stickiness of the photosensitive resist film.

(2) Description of the Prior Art

A process for preparing a printed-circuit board, in which an electrodeposited photosensitive resist is subjected to an electrodeposition coating, is known (see U.S. Pat. No. 3954587, U.S. Pat. No. 4592816, U.S. Pat. No. 4632900, U.S. Pat. No. 4673458, Japanese Patent Application Laid-Open Nos. 207139/85, 206293/86, 6070/88, etc.).

However, in the case where the above photosensitive resist is used, since a resist film is formed according to one-stage electrodeposition coating, when a pattern mask film in the form of a negative film or a positive film is lapped on the coated resist film to be exposed to light, both films easily stick together. Particularly, the both films are influenced by a temperature at which they are handled, and, in the worst case, both films stick together to such an extent that it is difficult for the pattern mask to be released and marks are formed on the resist film, often resulting in making automation difficult and in increasing occurrences of failures in circuit.

In order to prevent the above troubles, it may be considered to increase a glass transition temperature of a resin used in the electrodeposited resist. However increase in the glass transition temperature results in raising such problems that a film resistance at the time of electrodeposition coating is so increased as to make it impossible to obtain a satisfactory film thickness and that even if ultraviolet light is irradiated when exposed to light, curing properties of the film become poor and photosensitive properties are reduced.

On the other hand, in the case of an electrodeposition-coated positive photoresist, even a film in its unexposed area, too, has a polar group such as carboxyl group, amino group or the like and has a water-soluble property, resulting in raising such a problem that difference in solubilities in a developing solution between an exposed area and an unexposed area is smaller compared with a solvent based positive resist. Therefore, in order to obtain a satisfactory printed-circuit board by use of the electrodeposition-coated positive photoresist, it is necessary to strictly control surface characteristics of the photoresist, for example, by controlling solubility of the film in the developing solution or by making the film thickness uniform.

Generally, the electrodeposition-coated resist film contains water, solvent, neutralizing agent, etc. When they remain in the resist film, it has poor slickness and easily sticks to the pattern mask film. Therefore, it is a common practice to employ a drying step to evaporate the above volatile matters after the step of electrodeposition coating. However, if the drying is carried out at high temperatures or for a long time, the resist may react, often result in failures in development.

SUMMARY OF THE INVENTION

It is an object of the present invention to provide a process for preparing a printed-circuit board, which is capable of obtaining a resist film having a remarkably improved non-stickiness to the pattern mask film compared with the conventional electrodeposited resist film and having a good slickness, making possible an automatic application of the film, and remarkably improving failures relating to the pattern mask.

That is, the present invention provides an improved process for preparing a printed-circuit board, which comprises successive steps of electrodeposition coating of a photosensitive-resin on a printed-circuit base plate to form a photosensitive resist film, exposure to light, development and etching, the improvement further comprising a step of dipping the photosensitive resist film formed by electrodeposition coating into an aqueous solution comprising water as a major component and applying a voltage to carry out electroendosmosis.

DETAILED DESCRIPTION OF THE INVENTION

The photosensitive electrodeposition coating composition in the process of the present invention is basically a composition containing, as a major component, a resin having a photosensitive group and a salt-forming group to make water-soluble or water-dispersible, and may be classified into a negative electrodeposition coating composition and a positive electrodeposition coating composition.

NEGATIVE ELECTRODEPOSITION COATING COMPOSITION

The negative electrodeposition coating composition may include the conventional anionic or cationic electrodeposition coating composition which contains a water-soluble or water-dispersible, polymerizable unsaturated resin and a photopolymerization initiator as the major components. The polymerizable unsaturated resin used in the above coating composition may not specifically be limited so long as it is a water-soluble or water-dispersible resin containing an anionic or cationic group.

The typical examples of the polymerizable unsaturated resin may include (1) one containing, as the major component, a polymerizable unsaturated resin prepared by addition of a reaction product of a compound having a polymerizable unsaturated bond and hydroxyl group in one molecule with a diisocyanate compound to a high acid value acrylic resin having hydroxyl group on the skeleton, or a mixture of the above polymerizable unsaturated resin with an ethylenically unsaturated compound having one or more of a polymerizable unsaturated bond in one molecule; (2) one containing, as the major component, a mixture of a polymerizable unsaturated resin prepared by addition of $\alpha,\beta$-ethylenically unsaturated dibasic acid or an anhydride thereof to an unsaturated bond in the aliphatic acid chain of an esterification product between an epoxy resin having epoxy group and unsaturated fatty acid with an ethylenically unsaturated compound having one or more of apolymerizable unsaturated bond in one molecule; (3) one containing, as the major component, a mixture of a polymerizable unsaturated resin comprising an unsaturated fatty acid modified high acid value alkyd resin with anethylenically unsaturated compound having one or more of the polymerizable unsaturated bond in one molecule; (4) one containing, as the major component, a mixture of apolymerizable unsaturated resin comprising a maleic oil with an ethylenically unsaturated compound having one or more of a polymerizable unsaturated bond in one molecule; and (5) one containing, as the major component, a polymerizable unsaturated resin prepared by addition of a compound having a polymerizable unsaturated bond and glycidyl group in one molecule to a high acid value acrylic resin or a mixture of the above polymerizable unsaturated resin with an ethylenically unsaturated compond having one or more of a polymerizable unsaturated bond in one molecule.

Of the above polymerizable unsaturated resins, the polymerizable unsaturated resin in the above (5) is preferred.

The film-forming resin constituting the photographic negative type photo-curable cationic electrodeposition coating composition used in the present invention is the conventional resin containing an ethylenically unsaturated group such as acryloyl group, methacryloyl group or the like and amino group. As to the amino group, tertiary amino group is preferred, because primary and secondary amino groups are easily subjected to addition reaction with the ethylenically unsaturated group and have poor storage properties.

Examples of the resin containing the ethylenically unsaturated group and amino group include (1) a resin prepared by addition of primary or secondary amine to the epoxy compound followed by addition of an isocyanate compound containing the ethylenically unsaturated group to hydroxyl group; (2) a resin prepared by addition of a compound containing the ethylenically unsaturated group and carboxyl group to the epoxy group of a resin containing epoxy group and tertiary amino group; and (3) a resin prepared by addition of primary amine to a monoepoxy compound for secondary amination, followed by addition of a diepoxy compound or a polyepoxy compound in such an amount that a ratio of a number of equivalents between the secondary amine and epoxy group may be 1 to 2 or higher, and by the addition of the compound containing the ethylenically unsaturated group and carboxyl group to the remaining epoxy group, or prepared by addition of the isocyanate compound containing the ethylenically unsaturated group to hydroxyl group.

Advantageously, the above representative anionic or cationic polymerizable unsaturated resin contains carboxyl group in such an amount that an acid value is 20–300, preferably 40–110 when anionic and contains tertiary amino group and/or onium salt group, when cationic, in an amount of 0.2–5 moles, preferably 0.3–2.0 moles per one (1) kg of the resin, and has an unsaturation equivalent of 150–3,000, preferably 150–1,000 and a number average molecular weight of 300 or more, preferably 1,000–30,000.

Advantageously, the polymerizable unsaturated resin, prior to being exposed to light, has a glass transition temperature (hereinafter may be referred to as Tg) of −50° to 60° C., preferably −20° to 40° C. When the Tg is −50° C. or lower, the coating film at the time of electrodeposition coating is so soft that a film resistance may be reduced, resulting making it difficult to obtain a uniform coating film. On the other hand, when the Tg is 60° C. or higher, the film resistance may be increased, resulting in making it difficult to obtain a thick film, making it difficult for a chain transfer reaction to take place when exposed to light and making photosensitivity poor, and so forth.

Examples of the photopolymerization initiator incorporated in the photographic negative type photo-curable electrodeposition coating composition may include benzoin, benzoin methyl ether, benzoin ethyl ether, benzyl, diphenyl disulfide, tetramethylthiuram monosulfide, Eosine, Thionine, diacetyl, Michler's ketone, anthraquinone, α-hydroxyisobutylphenone, p-isopropyl-α-hydroxyisobutylphenone, α,α-dichloro-4-phenoxyacetophenone, 1-hydroxy-1-cyclohexylacetophenone, 2,2-dimethoxy-2-phenylacetophenone, methylbenzoyl formate, 2-methyl-1-[4-(methylthio)-phenyl]-2-morpholino propene, thioxanthone, benzophenone, and the like. The above photopolymerization initiator may be used in an amount of 0.1 to 10 parts by weight per 100 parts by weight of the resin component (as solids).

The photographic positive type electrodeposition coating composition used for forming the photographic positive type resist film in the present invention may include the conventionally known ones containing, as the major component, a water-soluble or water-dispersible resin having quinonediazido group, and more specifically ones containing, as the major component, a resin containing benzoquinonediazido unit or naphthoquinonediazido unit, and may be of the anionic or cationic type (see, for example, Japanese Patent Application Laid-Open Nos. 207139/85, 206293/86 and 6070/88, Japanese Patent Application Nos. 157841/87, 157842/87, 245840/87, and 279288/87, and the like).

The resin used in the above positive type electrodeposition coating composition and having the salt-forming group and photosensitive group is the same as the above representative unsaturated resin so far as the acid value, the amount of the tertiary amino group and/or onium salt group, the number average molecular weight and Tg are concerned except that it contains the photosensitive group such as benzo (or naphtho) quinone diazido unit in an amount of 5–60% by weight, preferably 10–50% by weight on the basis of the weight of the resin.

The water-solublization or water-dispersibilization of the resin for preparing the electrodeposition coating composition is carried out, in the case where an acid group such as carboxyl group is introduced into a resin skeleton, by neutralizing the acid group with an alkali as a neutralizing agent or, in the case where amino group is introduced thereinto, by neutralizing the amino group with an acid as a neutralizing agent.

A copper-clad laminated plate as a base plate, for example, is dipped into an electrodeposition coating bath comprising the electrodeposition coating composition obtained as above to usually apply a direct current under 20–400V for coating. The base plate is used as an anode for the anionic type electrodeposition coating, and is used as a cathode for the cationic type electrodeposition coating. The direct current is applied normally, for about 5 seconds to about 5 minutes. A coated film thickness is about 5 to about 100 μm, preferably 10–60 μm. The above application of the direct current is followed by washing with water, carrying out air blow, when needed, dipping into an aqueous solution to apply a voltage.

A liquid medium used for carrying out electroendosmosis by applying a voltage at a second stage in the present invention is basically an aqueous solution containing water as the major component. The aqueous solution has a non-volatizable residue of 1% by weight or less and a specific electric conductivity of 1 to 1000 $\mu\Omega^{-1}\text{cm}^{-1}$, preferably 10 to 100 $\mu\Omega^{-1}\text{cm}^{-1}$, and may contain a small amount of hydrophilic solvent or additives. The voltage applied when the electroendosmosis is carried out in the above aqueous solution is such that the application of a voltage equal to or higher than that applied when the electrodeposition is carried out at the first stage provides more effective results.

The electroendosmosis in the aqueous solution is normally carried out by applying a voltage of 80 to 200 V for 30 to 180 seconds.

The aqueous solution is desirably at a temperature of 10° C. to 30° C.

The application of voltage at the second stage under above conditions results in promoting electroendosmosis, promoting chelating between the resist and a metal such as copper, alloy, or stainless steel or the like of the base plate and improving the non-stickiness, drying properties, etc. of the resist film, and further tightening the resist film, making the resist film dense and decreasing pinholes.

Thereafter, a pattern mask is applied onto a photosensitive electrodeposition coating film formed on the base plate to be exposed to an active light such as ultraviolet light.

The active light is irradiated onto an area to be a conductor circuit when the photosensitive electrodeposition coating film is of a negative type, and onto unnecessary areas only other than the conductor circuit when the photosensitive electrodeposition coating film is of a positive type.

The active light used in exposure to light according to the present invention may desirably be one having a wave length of 3,000–4,500Å. Examples of the light sources of the above active light may include sun light, mercury lamp, xenon lamp, arc lamp, laser beam and the like. Examples of the mercury lamp may include high pressure mercury lamp, ultra-high pressure mercury lamp, metal halide lamp, chemical lamp and the like. Curing of the coating film by irradiation of the active light is effected within several minutes, normally in the range of one second to 20 minutes.

The developing treatment may be carried out, when the electrodeposition coating composition is of the anionic type, by spraying an aqueous weak alkali solution onto the make water-soluble, may include, for example, hydrochloric acid, phosphoric acid, acetic acid, formic acid, lactic acid and the like. It is also possible to carry out the above developing treatment by use of a solvent.

After the completion of the developing treatment, non-circuit area deposited on the base plate and composed of copper foil is removed by use of a ferric chloride solution, cupric chloride solution, etc., for example, for the anionic type, or by use of an alkaline solution, etc. for the cationic type according to the conventional etching treatment. Thereafter, the photo-cured film or unexposed film on the circuit pattern may be dissolved for removing in a cellosolve solvent such as ethyl cellosolve, ethyl cellosolve acetate and the like; an aromatic hydrocarbon solvent such as toluene, xylene and the like; a ketone solvent such as methyl ethyl ketone, methyl isobutyl ketone and the like; acetate solvent such as ethyl acetate, butyl acetate and the like: chlorinated solvent such as trichloroethylene; or an aqueous alkali solution such as a 3–10% aqueous caustic soda or caustic potash solution when the anionic electrodeposition coating composition is used, or an aqueous acid solution when the cationic electrodeposition coating composition is used, to form a printed-circuit on the base plate.

The present invention makes it possible to obtain a printed-circuit board completely free of failures in image, which are caused from traces of water drops when washed with water, by forming the photoresist on the copperclad, laminated plate as the base plate according to a combination of an anionic or cationic electrodeposition coating as the first stage with the electroendosmosis in the aqueous solution as the second stage. The reasons for the above are not accurately clarified, it is assumed that the application of the electroendosmosis as the second stage results in making the film denser, promoting the chelating, making the photoresist, which has been formed according to the electrodeposition coating as the first stage, to reflow and to compensate the traces of water drops.

The present invention is explained more in detail by the following Examples, in which "part" and "%" represent "part by weight" and "% by weight" respectively.

EXAMPLE 1

A mixture of 400 parts of methyl methacrylate, 400 parts of butyl acrylate, 200 pats of acrylic acid and 20 parts of azobisisobutyronitrile is dropped over 3 hours into 900 parts of propylene glycol monomethyl ether as a hydrophilic solvent at 110° C. under an atmosphere of nitrogen gas. The completion of the above dropping is followed by one hour's maturing, and a mixture of 10 parts of azobisdimethylvaleronitrile and 100 parts of propylene glycol monomethyl ether is dropped over one hour, followed by 5 hours' maturing to obtain a solution of a high acid value acrylic resin having an acid value of 155. Thereafter, to the above solution are added 240 parts of glycidyl methacrylate, acrylate, 1.2 parts of hydroquinone and 6 parts of tetraethylammonium bromide, followed by reacting for 5 hours at 110° C. blowing air thereinto to obtain an unsaturated resin solution having an acid value of about 50, a degree of unsaturation of 1.35 moles/kg.

To 2270 parts of the above unsaturated resin solution is added 67 parts of triethylamine to be sufficiently neutralized, followed by adding 60 parts of α-hydroxyisobutylphenone as a photopolymerization initiator to be mixed, and by adding deionized water in such an amount as to obtain an electrodeposition coating bath (pH: 6.7) having a solids content of 15%. The electrodeposition coating is carried out by use of the above electrodeposition coating bath under such conditions that a copper-clad laminated plate for use in the printed circuit board and having through-holes is used as an anode, that the bath temperature is 25° C., and that a direct current is applied for 3 minutes under a current density of 60 mA/dm$^2$, resulting in that the film thickness is 17μm.

The coated film is washed with water, followed by dipping into a water having a specific electric conductivity of 10 $\mu\Omega^{-1}\text{cm}^{-1}$, and applying a voltage of 120 V by using the electrodeposition-coated base plate as an anode to be kept for one minutes.

Thereafter, drying is carried out at 80° C. for 10 minutes to obtain a non-sticky, smooth photo-sensitive film. Thereafter, a pattern mask film is lapped on the photosensitive resist film to be vacuumed and exposed to light at a dose of 300 mj/cm$^2$ by use of an ultra-high pressure mercury lamp. The resist film thus obtained shows satisfactory non-stickiness and good slickness to the pattern mask film.

The above resist is subjected to developing treatment with a 1% sodium carbonate solution, followed by washing with water, and carrying out etching treatment with cupric chloride to obtain a pattern circuit.

The base plate after etching has few or no pinholes.

COMPARATIVE EXAMPLE 1

The procedures of Example 1 are repeated except that the application of the voltage after the electrodeposition coating is not carried out, with the result that the resist film shows unsatisfactory non-stickiness and poor slickness to the pattern mask film, and that the base plate after etching has 2 to 3 pinholes per a size of 10cm × 10cm.

EXAMPLE 2

A mixture of 39 parts of methyl methacrylate, 39 parts of butyl acrylate and 22 parts of glycidyl methacrylate is copolymerized to obtain a glycidyl group-containing acrylic resin. The above polymer is reacted with 8 parts of diethanolamine to obtain a cationic resin having an amine value of 40. To the cationic resin is added 6.5 parts of acrylic acid to be reacted with a residual glycidyl group of the above cationic resin to obtain an unsaturated cationic resin varnish having a degree of unsaturation of 0.8 mole/kg.

The above resin varnish is neutralized with acetic acid, followed by adding 5% of $\alpha$-hydroxyisobutylphenone as a photopolymerization initiator based on the weight of the resin, and by adding deionized water in such an amount as to obtain an electrodeposition coating bath (pH: 6.0) having a solids content of 17%.

An electrodeposition coating is carried out by using an aluminum plate as a cathode so as to form a film having a thickness of 15μm, followed by dipping into an aqueous solution containing 0.5% of butanol and having a specific electric conductivity of 8 $\mu\Omega^{-1}cm^{-1}$, and applying a voltage of 110 V for 90 seconds by using the base plate as the cathode, and hydro-extracting and drying at 85° C. for 10 minutes. The resulting resist film shows good slickness to the pattern mask film.

Thereafter, an ultraviolet light is irradiated at a dose of 200 mj/cm$^2$ by use of a high pressure mercury lamp to be exposed to light, followed by developing treatment and etching treatment with the result that the base plate has no pinholes.

COMPARATIVE EXAMPLE 2

The procedures of Example 2 are repeated except that the application of the voltage in the aqueous solution is not carried out with the result that the resist film after the electrodeposition coating shows poor slickness to the pattern mask film, and that the base plate after etching has 2 pinholes per a size of 10cm × 10cm.

EXAMPLE 3

Into a four-necked flask are introduced 210 parts of tert-butylaminoethyl methacrylate, 90 parts of dioxane and 130 parts of triethylamine, followed by heating up to 40° C., dropping a solution prepared by dissolving 270 parts of orthonaphthoquinonediazidosulfonic chloride in 1080 parts of dioxane over one hour with agitation, and by keeping at 40° C. for 3 hours.

The resulting solution is introduced into deionized water to precipitate a reaction product. The precipitate is placed in a vacuum dryer to remove solvent and to obtain a naphthoquinonediazido group-containing unsaturated monomer A.

Into a four-necked flask is introduced 600 parts of ethylene glycol monoethyl ether, followed by heating up to 60° C., dropping over 3 hours a mixed solution of 350 parts of the unsaturated monomer A, 250 parts of methyl methacrylate, 250 parts of n-butyl acrylate, 120 parts of N,N-dimethylaminoethyl acrylate and 50 parts of azobisdimethylvaleronitrile, keeping for one hour, dropping over one hour a mixed solution of 70 parts of ethylene glycol monoethyl ether and 5 parts of azobisdimethylvaleronitrile, and by further keeping for two hours to obtain a photographic positive type photo-sensitive resin solution having an amine value of 48. To the above photo-sensitive resin solution is added 25 parts of acetic acid to be neutralized, followed by adding deionized water in such an amount as to obtain an electrodeposition coating bath having a solids content of 10.5%. An electrodeposition coating is carried out under such conditions that a copper-clad laminated plate having through-holes is used as a cathode, and that a direct current under 120 V is applied for 2.5 minutes at a bath temperature of 25° C. The completion of the electrodeposition coating is followed by drying at 60° C. for 7 minutes to obtain a smooth photosensitive resist film having a thickness of 5 μm, followed by dipping into an aqueous solution having a specific electric conductivity of 8 $\mu\Omega^{-1}cm^{-1}$, and applying a voltage of 150 V for 80 seconds. The resulting resist film shows no stickiness to the pattern mask film after being exposed to light, and the base plate after etching has no pinholes.

COMPARATIVE EXAMPLE 3

The procedures of Example 3 are repeated except that the application of the voltage in the aqueous solution with the result that the resist film after the electrodeposition coating shows some stickiness to the pattern mask film after being exposed to light, and that the base plate after etching has 3 pinholes per 100 cm$^2$.

EXAMPLE 4

Into a four-necked flask is introduced 400 parts of methylisobutyl ketone, followed by heating up to 80° C. with agitation, dropping over 3 hours a mixed solution of 240 parts of tert-butylaminoethyl methacrylate, 400 parts of methyl acrylate, 50 parts of acrylic acid and 35 parts of azobisisobutylonitrile, keeping for one hour, dropping over one hour a mixed solution of 80 parts of methylisobutyl ketone and 10 parts of azobisdimethylvaleronitrile, keeping for 2 hours, cooling down to 40° C., dropping over 2 hours a mixed solution of 270 parts of orthonaphthoquinonediazidosulfonic chloride and 630 parts of dioxane, and by keeping for 2 hours to obtain a photographic positive type photosensitive resin.

Next, to the above photo-sensitive resin are added 200 parts of ethylene glycol monomethyl ether and 60 parts of dimethyl ethanol amine to be sufficiently neutralized, and followed by adding deionized water in such an amount as to obtain an electrodeposition coating bath (pH: 6.8) having a solids content of 14%.

An electrodeposition coating is carried out under such conditions that the copper-clad laminated plate is used as an anode, and that a current and voltage are controlled so as to obtain a film thickness of 10 μm.

The resulting coated plate is dipped into an aqueous solution having a specific electric conductivity of 4

$\mu\Omega^{-1}\text{cm}^{-1}$, followed by applying a voltage of 120 V for 120 seconds.

The results show that the resulting resist film shows good slickness and improved non-stickiness to the pattern mask film, and that the base plate after etching has no pinholes.

COMPARATIVE EXAMPLE 4

The procedures of Example 4 are repeated except that the application of the voltage in the aqueous solution is not carried out with the result that the resist film shows some stickiness to the pattern mask film after being exposed to light, and that the base plate after etching has 3 pinholes per 100 cm$^2$.

What is claimed is:

1. An improved process for preparing a printed-circuit board, which comprises successive steps of electrodeposition coating of a photosensitive resin on a printed-circuit base plate to form a photosensitive resist film, exposure to light through a pattern mask, development and etching, the improvement further comprising a step of dipping the photosensitive resist film formed by electrodeposition coating into an aqueous solution comprising water as a major component and having a non-volatizable residue of 1% by weight or less and applying a voltage to carry out electroendosmosis whereby the tendency of the photosensitive resist film to stick to the pattern mask is reduced.

2. An improved process as claimed in claim 1, wherein the aqueous solution has a specific electric conductivity of 1 to 1000$\mu\Omega^{-1}\text{cm}^{-1}$.

3. An improved process as claimed in claim 1, wherein the aqueous solution has a specific electric conductivity of 10 to 100$\mu\Omega^{-1}\text{cm}^{-1}$.

4. An improved process as claimed in claim 1, wherein the aqueous solution is at a temperature of 10° C. to 30° C.

5. An improved process as claimed in claim 1, wherein the voltage to carry out electroendosmosis is equal to or higher than that applied when the electrodeposition coating is carried out.

6. An improved process as claimed in claim 1, wherein the electroendosmosis in the aqueous solution is carried out by applying a voltage of 80 to 200V for 30 to 180 seconds.

* * * * *